United States Patent
Lee et al.

(10) Patent No.: US 11,429,314 B2
(45) Date of Patent: Aug. 30, 2022

(54) STORAGE DEVICE, STORAGE SYSTEM AND OPERATING METHOD THEREOF

(71) Applicant: SAMSUNG ELECTRONICS CO., LTD., Suwon-si (KR)

(72) Inventors: Ji Min Lee, Suwon-si (KR); Byeong Hui Kim, Suwon-si (KR); Kang Ho Roh, Suwon-si (KR); Jung Min Seo, Suwon-si (KR); Seung Jun Yang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 163 days.

(21) Appl. No.: 16/909,609

(22) Filed: Jun. 23, 2020

(65) Prior Publication Data
US 2021/0181986 A1    Jun. 17, 2021

(30) Foreign Application Priority Data

Nov. 8, 2019    (KR) .................... 10-2019-0142181

(51) Int. Cl.
*G06F 3/06* (2006.01)
*G06N 3/02* (2006.01)

(52) U.S. Cl.
CPC .......... *G06F 3/0659* (2013.01); *G06F 3/0604* (2013.01); *G06F 3/0679* (2013.01); *G06N 3/02* (2013.01)

(58) Field of Classification Search
CPC .... G06F 3/0659; G06F 3/0604; G06F 3/0679; G06F 3/0616; G06F 3/064; G06F 3/0614; G06F 3/0652; G06F 3/0656; G06F 3/061; G06F 3/0631; G06F 12/0246; G06F 2212/1016; G06N 3/02; G11C 16/3495; G11C 16/10; G11C 16/16
See application file for complete search history.

(56) References Cited

U.S. PATENT DOCUMENTS

| | | | |
|---|---|---|---|
| 7,430,632 B2 | 9/2008 | Kim et al. | |
| 8,825,942 B2 | 9/2014 | Ye et al. | |
| 8,984,219 B2 | 3/2015 | Park et al. | |
| 9,747,214 B2 | 8/2017 | Bagg | |
| 2013/0179632 A1* | 7/2013 | Ben-Shemesh | G06F 12/0862 711/E12.002 |
| 2016/0170639 A1* | 6/2016 | Velayudhan | G06F 3/0689 711/114 |

(Continued)

FOREIGN PATENT DOCUMENTS

JP    6468100 B9    1/2019

*Primary Examiner* — Francisco A Grullon
(74) *Attorney, Agent, or Firm* — Volentine, Whitt & Francos, PLLC

(57) ABSTRACT

A storage device includes; an interface receiving data and a corresponding LBA from a host, wherein the data includes at least one of first data having a stream ID and second data lacking a stream ID, a nonvolatile memory (NVM) device including at least one nonvolatile memory configured to store the data, and a LBA predictor configured to provide a predicted stream ID for the second data using a neural network model operating in response to at least one feature associated with LBA values received by the storage device from the host, wherein the first data is stored in the NVM device using the stream ID, and the data is stored in the NVM device using the predicted stream ID.

18 Claims, 13 Drawing Sheets

(56) References Cited

U.S. PATENT DOCUMENTS

| | | | |
|---|---|---|---|
| 2018/0074700 A1* | 3/2018 | Tsalmon | G06F 3/061 |
| 2018/0357535 A1 | 12/2018 | Shulkin et al. | |
| 2019/0129834 A1* | 5/2019 | Purkayastha | G06F 12/0246 |
| 2019/0146716 A1 | 5/2019 | Yang et al. | |
| 2019/0156195 A1 | 5/2019 | Gervais | |
| 2019/0205274 A1* | 7/2019 | Bhimani | G06F 3/0659 |
| 2019/0361628 A1* | 11/2019 | Yaromenka | G06F 3/061 |
| 2020/0192602 A1* | 6/2020 | Benisty | G06F 9/5016 |

* cited by examiner

FIG. 2

| | BLK 1 | BLK 2 | BLK 3 |
|---|---|---|---|
| Row1 ··· | DATA1(SID 1) | DATA3(SID 1) | DATA5(SID 1) |
| Row2 ··· | DATA2(SID 2) | DATA4(SID 2) | DATA6(SID 3) |
| Row3 ··· | | | |
| Row4 ··· | | | |
| Row5 ··· | | | |

FIG. 3

| | BLK 1 | BLK 2 | BLK 3 |
|---|---|---|---|
| Row1 ··· | DATA1(SID 1) | DATA2(SID 2) | DATA6(SID 3) |
| Row2 ··· | DATA3(SID 1) | DATA4(SID 2) | |
| Row3 ··· | DATA5(SID 1) | | |
| Row4 ··· | | | |
| Row5 ··· | | | |

FIG. 8

LBA Size Table

| Step | Start LBA | LBA Size | End LBA |
|------|-----------|----------|---------|
| N1   | 100       | 50       | 150     |
| N2   | 200       | 30       | 230     |
| N3   | 250       | 40       | 290     |
| ⋮    |           |          |         |
| Nm   | 300       | 30       | 330     |
| ⋮    |           |          |         |
| Nm+k | 500       | 30       | 530     |

STORAGE DEVICE, STORAGE SYSTEM AND OPERATING METHOD THEREOF

CROSS-REFERENCE TO RELATED APPLICATION

This application claims priority under 35 U.S.C. 119 to Korean Patent Application No. 10-2019-0142181 filed on Nov. 8, 2019, the subject matter of which is hereby incorporated by reference.

BACKGROUND

1. Technical Field

The present disclosure relates to storage devices, storage systems and operating methods for storage devices and/or storage systems.

2. Description of the Related Art

Storage devices including at least one nonvolatile memory may experience problems associated with write amplification. Write amplification issues may arise as a ratio between a number of write operations executed by the nonvolatile memory and a number of write operations requested by a host becomes skewed. Write amplification issues may arise when a storage device performs a large number of randomly addressed write operations. Write amplification issues may reduce write performance of the storage device and increase the overall wear of the constituent nonvolatile memory cells, thereby reducing the durability and reliability of the storage device.

In order to mitigate or prevent the adverse effects of write amplification, logical block addresses (LBA) associated with one or more data stream identifier(s) (ID) may be used in relation to the storage device. Accordingly, the storage device must be able to accurately ascertain LBA values associated with a stream ID. Further, the storage device must be able to associate a particular stream ID with LBA values to which the same stream ID has been assigned.

SUMMARY

Embodiments of the present disclosure provide a storage device capable of accurately predicting LBA values to which the same stream ID should be assigned for a write operation.

Embodiments of the present disclosure provide a storage system capable of accurately predicting LBA values to which the same stream ID should be assigned for a write operation.

Embodiments of the present disclosure provide an operating method for a storage system capable of accurately predicting LBA values to which the same stream ID should be assigned for a write operation.

According to an aspect of the present inventive concept, there is provided a storage device including; a buffer memory configured to store first identifier (ID)-specific Logical Block Address (LBA) related information associated with a first stream ID and further associated with 'm' LBA values, and second ID-specific LBA related information associated with a second stream ID and further associated with 'n' LBA values, and an LBA predictor including a neural network model and configured to predict an $(m+k)^{th}$ LBA value based on the first ID-specific LBA related information and predict an $(n+l)^{th}$ LBA value based on the second ID-specific LBA related information, where n, m, k and l are natural numbers. The neural network model may be configured to receive the first ID-specific LBA related information as a first feature used to predict the $(m+k)^{th}$ LBA value, receive the second ID-specific LBA related information as a second feature used to predict the $(n+l)^{th}$ LBA value, assign the first stream ID to an LBA value greater than an $m^{th}$ LBA value and less than or equal to the $(m+k)^{th}$ LBA value, and assign the second stream ID to an LBA value greater than an $n^{th}$ LBA value and less than or equal to the $(n+l)^{th}$ LBA value.

According to an aspect of the present inventive concept, there is provided a storage device including; an interface configured to receive data and a corresponding Logical Block Address (LBA) from a host, wherein the data includes at least one of first data having a stream ID and second data lacking a stream ID, a nonvolatile memory (NVM) device including at least one nonvolatile memory configured to store the data, a buffer memory, and a LBA predictor configured to provide a predicted stream ID for the second data using a neural network model operating in response to at least one feature associated with LBA values received by the storage device from the host, wherein the first data is stored in the NVM device using the stream ID, and the data is stored in the NVM device using the predicted stream ID.

According to an aspect of the present inventive concept, there is provided a storage system including; a host configured to output 'm' Logical Block Address (LBA) values; and a storage device. The storage device includes; an interface configured to communicate with the host and receive the m LBA values, a buffer memory configured to temporarily store the m LBA values, a nonvolatile memory device configured to store data corresponding to the m LBA values, and an LBA predictor configured to predict an $(m+k)^{th}$ LBA value using a neural network model in response LBA related information input to the neural network as a feature.

According to an aspect of the present inventive concept, there is provided an operating method for a storage system. The method including; storing Logical Block Address (LBA) related information in a buffer memory, wherein the LBA related information is associated with 'm' LBA values, predicting with the use of an LBA predictor including a neural network model, an $(m+k)^{th}$ LBA value in response to the LBA related information, and assigning a predicted stream ID to an LBA value greater than an $m^{th}$ LBA value and less than or equal to the $(m+k)^{th}$ LBA value.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which:

FIGS. 2 and 3 are conceptual diagram further illustrating write amplification, and the use of stream IDs to address write amplification issues.

FIG. 8 is a table further listing exemplary LBA information that may be used to predict LBA values according to some embodiments.

DETAILED DESCRIPTION

Certain embodiments will now be described in relation to the accompanying drawings. Throughout the illustrated embodiments and related written description, like reference numbers and labels are used to denote like or similar elements.

Figure 4:
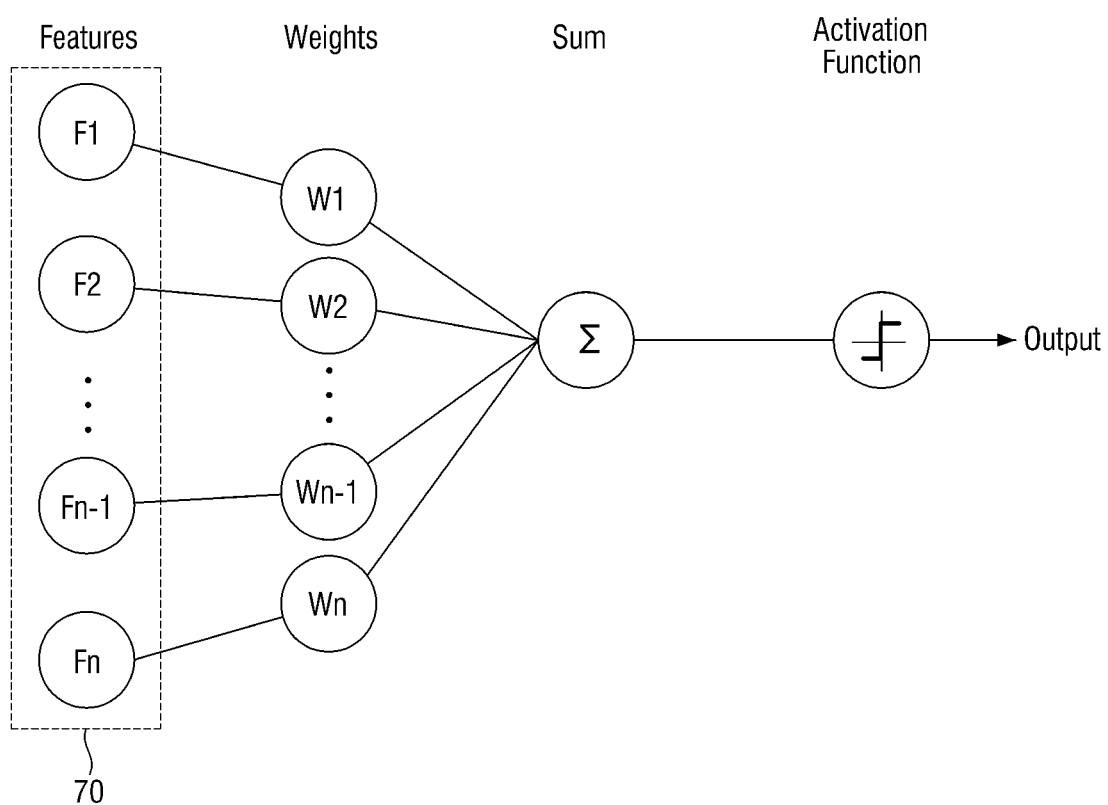
FIG. 4 is a conceptual diagram illustrating an operation of a storage device predicting a logical block address (LBA) value using a neural network model according to some embodiments.

Figure (FIG.) 1 is a block diagram illustrating a storage system according to some embodiments. FIG. 2 is a conceptual diagram further describing write amplification, and FIG. 3 is a conceptual diagram further describing a state wherein stream identifiers (hereafter, "IDs") are assigned by the storage system. FIG. 4 is a flow diagram further describing operation of a storage device predicting a logical block address (LBA) value using a neural network model according to some embodiments.

Figure 1:
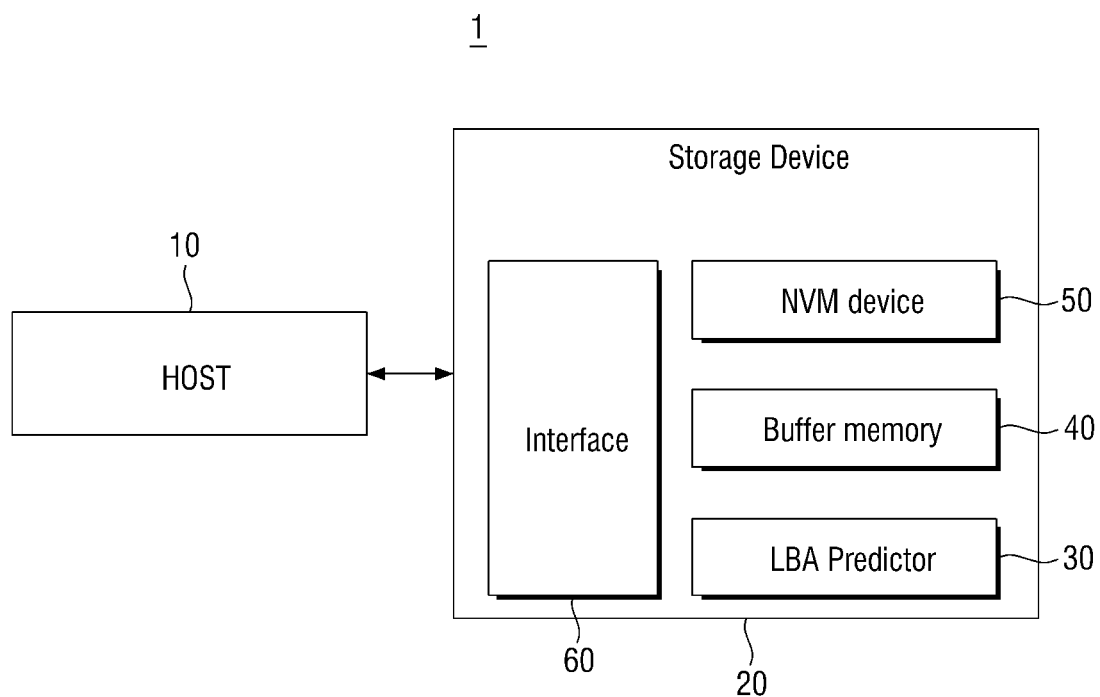
FIG. 1 is a block diagram illustrating a storage system according to some embodiments.

Referring to FIG. 1, a storage system 1 may generally include a host 10 and a storage device 20.

The storage device 20 may include an interface 60 configured to facilitate communication between the host 10 and the storage device, a nonvolatile memory device (NVM) 50 including one or more nonvolatile memories, a buffer memory 40, and an LBA predictor 30.

The host 10 may transmit data including an associated ID to the storage device 20 during a write (or program) operation executed by the storage device 20 (e.g., a solid state drive (SSD)). The host 10 may assign the ID to the data depending (e.g.) on the data type (e.g., a log file, a meta file, a media file, etc.). In this context the term "type" may refer to various features or attributes of the data. Once the host 10 has assigned a particular ID to the data, the data may be transmitted to the storage device 20 as part of a multi-stream data set. For example, the host 10 may allocate a first ID to first data having a log file type, and allocate a second ID to data having a media file type.

In this context, the storage device 20—being configured to receive a plurality of IDs associated with a data set—may be referred to as a multi-stream storage device. The multi-stream storage device may provide operating systems and applications having interfaces through which data having different attributes may be individually stored. The respective process(es) by which individual data are stored may be referred to as "streams." That is, a collection (or "group") of individual data write operations may be included in an aggregate "stream", wherein each stream may be particularly identified by a corresponding "stream ID" assigned (e.g.) by an operating system or corresponding application. Thus, disparate data having similar features or attributes may be assigned a unique ID so that the data corresponding to the unique stream ID may be written to the same block in the NVM device 50 of the storage device 20.

However, when data lacking a stream ID is received from the host 10, the storage device 20 may store the data lacking a stream ID in an arbitrary block. As a result, data having different stream IDs may be written in the same block. This outcome will be described in some additional detail hereafter with reference to FIG. 2.

Referring to FIGS. 1 and 2, when data lacking a stream ID is received from the host 10, the storage device 20 may arbitrarily write the data lacking a stream ID to (e.g.) respective blocks BLK1, BLK2, and BLK3 of the NVM 50 in the storage device 20.

As previously noted, the NVM 50 may include a plurality of nonvolatile memories. Each of the plurality of nonvolatile memories may include nonvolatile memory cells (e.g.) NAND flash memory cells, NOR flash memory cells, resistive random access memory (RRAM) cells, ferroelectric random access memory (FRAM) cells, phase change random access memory (PRAM) cells, thyristor random access memory (TRAM) cell, magnetic random access memory (MRAM) cells, etc.

In the illustrated example of FIG. 2, it is assumed that the storage device 20 receives six (6) individual data (e.g., first data DATA1 to sixth data DATA6) from the host 10 and respectively assigns (e.g., using an arbitrarily established assignment sequence, randomly, etc.) each of first data DATA1 to the sixth data DATA6 and to one of the blocks BLK1, BLK2, and BLK3.

For example, the storage device 20 may store the first data DATA1 in a first row Row1 of the first block BLK1, and the second data DATA2 in a second row Row2 of the first block BLK1. The storage device 20 may store the third data DATA3 in a first row Row1 of the second block BLK2, and the fourth data DATA4 in a second row Row2 of the second block BLK2, and store the fifth data DATA5 in a first row Row1 of the third block BLK3, and the sixth data DATA6 in a second row Row2 of the third block BLK3.

Under these assumptions, and recognizing that none of the first data DATA1 to the sixth data DATA6 has an assigned stream ID, the storage device 20 may arbitrarily write each one of the first data DATA1 to the sixth data DATA6 in a one of the blocks BLK1, BLK2, and BLK3. However, there are stream IDs that should have been assigned to each one of the first data DATA1 to the sixth data DATA6 received by the storage device 20 depending (or based) on the particular type of the data.

That is, when the first data DATA1 to the sixth data DATA6 are received from the host 10 but lack respective stream IDs, the storage device 20 arbitrarily (e.g., randomly) stores the first data DATA1 to the sixth data DATA6 in blocks BLK1, BLK2, and BLK3. However, the storage device 20 should, more appropriately, assign a stream ID to each of the first data DATA1 to the sixth data DATA6 depending on its type, and then allocate all data among the first data DATA1 to the sixth data DATA6 having the same stream ID to the same block.

Referring to FIGS. 1, 2 and 3 and with the foregoing assumptions in mind, the storage device 20 should "reallocate" the arbitrarily written data (e.g., the data shown in FIG. 2) such that data having the same stream ID is written in the same block (as shown in FIG. 3).

For example, the storage device 20 may reallocate (i.e., write or program) the first data DATA1, the third data DATA3, and the fifth data DATA5 having a first stream ID (SID1) to the first block BLK1; reallocate the second data DATA2 and the fourth data DATA4 having a second stream ID (SID2) to the second block BLK2, and reallocate the sixth data DATA6 having a third stream ID (SID3) to the third block BLK3. As a result of the reallocation process, the storage device 20 may erase the first block BLK1 and then write the first data DATA1, the third data DATA3, and the fifth data DATA5 in the first block BLK1; erase the second block BLK2 and then write the second data DATA2 and the fourth data DATA4 in the second block BLK2; and erase the third block BLK3 and then write the sixth data DATA6 in the third block BLK3.

Thus, in order to reallocate data having the same stream ID to the same block, the storage device 20 must perform numerous, additional erase and/or write operations beyond the write operations required to initially (and arbitrarily) write the data received from the host 10. The execution of these additional erase and/or write operations contributes to the write amplification problem noted above. For example, write amplification may reduce the write operation performance of the storage device 20 and increase the wear of constituent nonvolatile memory cells of the NVM 50 in the storage device 20, thereby reducing the durability of the storage device 20.

In order to mitigate or prevent write amplification, upon receiving a write command associated with data lacking a stream ID and before actually writing the data lacking a stream ID to the NVM 50, the storage device 20 may predict a stream ID for the data, and thereafter write the data having a predicted stream ID to a memory block based on the predicted stream ID.

The prediction of a stream ID for particular data may be performed using "LBA related information" (e.g., LBA values, LBA sizes, a number of times that respective LBAs are received, time intervals according to which respective LBAs are received, etc.) applied to a neural network (NN) model. That is, the storage device 20 may predict a stream ID for data lacking a stream ID using a neural network model in order to improve the accuracy of the one or more write operations used to initially write the data lacking a stream ID among available memory blocks, as compared with the arbitrary writing of data lacking a as stream ID.

In effect, the foregoing approach seeks to accurately predict a stream ID (e.g., a LBA value) for data lacking a stream ID before it is stored in the NVM device 50 (i.e., the same stream ID may be more accurately assigned to LBA values to which the same stream ID should be assigned). Therefore, the storage device 20 may accurately predict the LBA values to which the same stream ID should be assigned and store the data based on the predicted LBA values in the same block, thereby reducing write amplification and improving the reliability of the storage device 20. Hereinafter, an exemplary operation of predicting LBA values to which the same stream ID should be assigned will be described in some additional detail.

Notably, the number and type of data received by the storage device 20 from the host 10 are not limited to those illustrated in FIGS. 2 and 3. In addition, the number and type of blocks in the storage device 20 used to store the data are not limited to those illustrated in FIGS. 2 and 3. Further, in certain embodiments data may be stored on a page basis.

Referring again to FIG. 1, the host 10 may take one of many possible forms, including that of a processing unit, a host memory, an interface circuit, etc. Here, the processing unit may execute various software (e.g., application programs, operating systems, device drivers, and the like) loaded in the host memory. The processing unit may execute an operating system (OS) or application programs. The processing unit may include homogeneous multi-core processors or heterogeneous multi-core processors. For example, the processing unit may include at least one of a central processing unit (CPU), an image processing unit (ISP), a digital signal processing unit (DSP), a graphics processing unit (GPU), a vision processing unit (VPU), and a neural processing unit (NPU), but is not limited thereto.

An application program, a file system, a device driver, and the like for driving the storage system 1 may be loaded in the host memory. However, it is not limited thereto, and various other software for driving the storage device 20 may be loaded in the host memory. The host memory may be loaded with application programs or data to be processed by the processing unit. For example, an input/output scheduler (not shown) for managing submission queues and completion queues for commands to be delivered to the storage device 20 may be loaded into the host memory.

The interface circuit may provide physical connections between the host 10 and the storage device 20. For example, the interface circuit may convert commands, addresses, data sets, and the like corresponding to various requests generated by the host 10 into an interfacing form with the storage device 20. For example, the interface circuit may be configured to communicate with the storage device 20 by using at least one of various communication methods such as Universal Serial Bus (USB), Serial AT Attachment (SATA), Serial Attached SCSI (SAS), High Speed Inter Chip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), Multi Media Card (MMC), and Embedded MMC (Emmc), but the configuration is not limited thereto.

The interface 60 in the storage device 20 may process various commands provided from the host 10. The various commands provided from the host 10 may include data having (or lacking) one of a plurality of possible stream IDs. Alternatively, the various commands provided from the host 10 may include data having no stream IDs assigned thereto. The interface 60 may be sued to transmit data to the NVM 50. Alternatively, when the interface 60 receives a read command from the host 10, the interface 60 may be used to read data from the NVM 50.

The interface 60 may be implemented as a circuit such as a Field Programmable Gate Array (FPGA), Application Specific Integrated Circuits (ASIC), and the like or may be implemented as a combination of a processor and software executed by the processor, but the implementation of the interface 60 is not limited thereto.

The interface 60 may be used to temporarily store data in the buffer memory 40. Alternatively, the interface 60 may be used to load data from the buffer memory 40. The buffer memory 40 may temporarily store LBA related information, where the LBA related information may be continuously updated according (e.g.) to an established update schedule or interval. In this manner, an expanding body of LBA related information (hereafter, at any moment in time, referred to simply as "the LBA related information") may be used by a neural network model in the LBA predictor 30 to predict a stream ID for received data. The LBA related information may be variously stored in the storage system 1 or in an external environment accessible to the storage system 1, including (e.g.) the buffer memory 40. Here, the buffer memory 40 may include volatile memory cells such as a dynamic random access memory (DRAM) cell, a static random access memory (SRAM) cell, and the like.

The LBA predictor 30 in the storage device 20 may be used to assign a predicted stream ID in relation to LBA values for data received from the host 10 using the neural network model which operates in response to the LBA related information.

One example of a neural network model that may be used in certain embodiments of the LBA predictor 30 is illustrated in FIG. 4.

Referring to FIGS. 1 and 4, the neural network model of the LBA predictor 30 of the storage device 20 may receive, as "features", the LBA related information. Thus, in the illustrated example of FIG. 4, the LBA related information may include (e.g., LBA values F1, LBA sizes F2, a number of times Fn−1 at which specific LBAs are received, time intervals Fn over which LBAs are received, etc.).

These features may be bundled in a feature pool 70 and temporarily stored in the buffer memory 40 or in a feature buffer 32 to be described hereafter.

Certain LBA related information as it is received into the body of LBA related information may be configured into separate LBA information for the same stream ID. Hereafter, certain LBA related information that has been grouped, associated or configured in accordance with a particular stream ID will be referred to as "ID-specific LBA related information." Thus, the LBA related information may variously include first ID-specific LBA related information; second ID-specific LBA related information, etc.

ID-specific LBA related information may be variously channeled and bundled into the feature pool 70 of the neural network model. One possible approach to the channeling and/or bundling of ID-specific LBA related information will be described in some additional detail with reference to FIG. 6.

In the description that follows, it is assumed that first ID-specific LBA related information has been received by the neural network model of FIG. 4 and correspondingly bundled in the feature pool 70.

The neural network model used by the LBA predictor 30 uses the respective features of the feature pool 70 as inputs, and may respectively ascribe or assign a corresponding weighting (e.g., weights W1, W2, ..., Wn−1 and Wn) to the features. For example, a first feature F1 (e.g., LBA values) may be weighted with a first weight W1, a second feature F2 (e.g., LBA sizes) may be weighted with a second weight W2, etc., in order to corresponding generate a first weighted feature value (F1×W1), a second weighted feature value (F2×W2), etc.

Thereafter, the LBA predictor 30 may add (or sum) the weighted features values to generate a summation result. The summation result may be used to predict an appropriate LBA value using an activation function, $f$. Accordingly, the predicted LBA value may be provided as an output through the activation function $f$ as shown, for example, in the following equation:

$$\text{Output} = f(F1*W1 + F2*W2 + \ldots + Fn\text{−}1*Wn\text{−}1 + Fn*Wn)$$

FIG. 4 assumes the use of a relatively simple neural network model by the LBA predictor 30. However, those skilled in the art will recognize that the neural network model used by the LBA predictor 30 may use a variety of neural network models including a single layer perceptron (SLP) model or a multi-layer perceptron (MLP) model. The structure of the neural network model used by the LBA predictor 30 may be a nonlinear regression model or a classification model. Furthermore, the features used by the LBA predictor 30 may vary in nature and number from the examples noted above. However, different ID-specific LBA related information associated with the same stream ID may be grouped into the same feature pool 70 and used as an input to the neural network model.

Hereinafter, certain operating principles for the LBA predictor 30 will be described in some additional detail with reference to graph(s). Further, possible approaches to the assignment and/or allocation of the same stream ID based on predicted LBA values derived from a neural network model using ID-specific LBA related information as inputs will be described.

Figure 5:
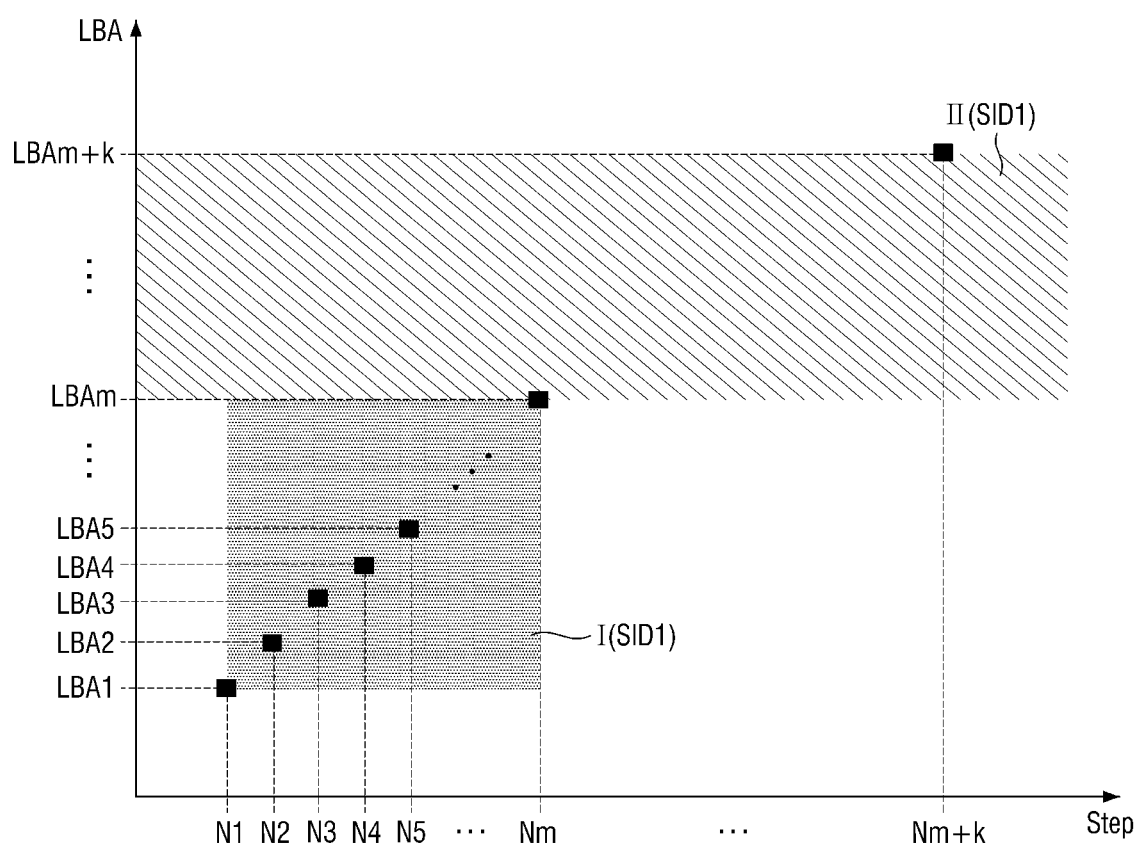
FIGS. 5, 6 and 7 are respective graphs further illustrating operation of the storage device predicting LBA values according to some embodiments.

FIG. 5 is a graph illustrating operation of a storage device providing predicted LBA values according to some embodiments.

Referring to FIGS. 1, 4 and 5, the LBA predictor 30 may read specific LBA values from a stored body of previously received LBA values (e.g., LBA1 through LBAm) as the features of the neural network model. That is, the LBA values falling within a first area 'I' may be input as the features of the neural network model. The LBA values of the first area 'I' may all be associated with the same stream ID (e.g., the first stream ID). Using this information, the LBA predictor 30 may drive a neural network model to predict the $(m+k)^{th}$ LBA value (e.g., LBAm+k).

Thereafter, the LBA predictor 30 may receive data (e.g., LBA values) lacking a stream ID, and may determine an area of the graph in which the LBA values are likely to be located. The LBA predictor 30 may then assign (e.g.) a first stream ID (SID1) to received LBA values falling within a second area 'II' of the graph, larger than the $m^{th}$ LBA value (LBAm) and less than or equal to the $(m+k)^{th}$ LBA value (LBAm+k).

For the LBA values lacking stream IDs, the LBA predictor 30 may assign stream IDs in advance provide predicted stream IDs that may be used to write data having the same stream ID into the same block in the NVM 50.

Figure 6:
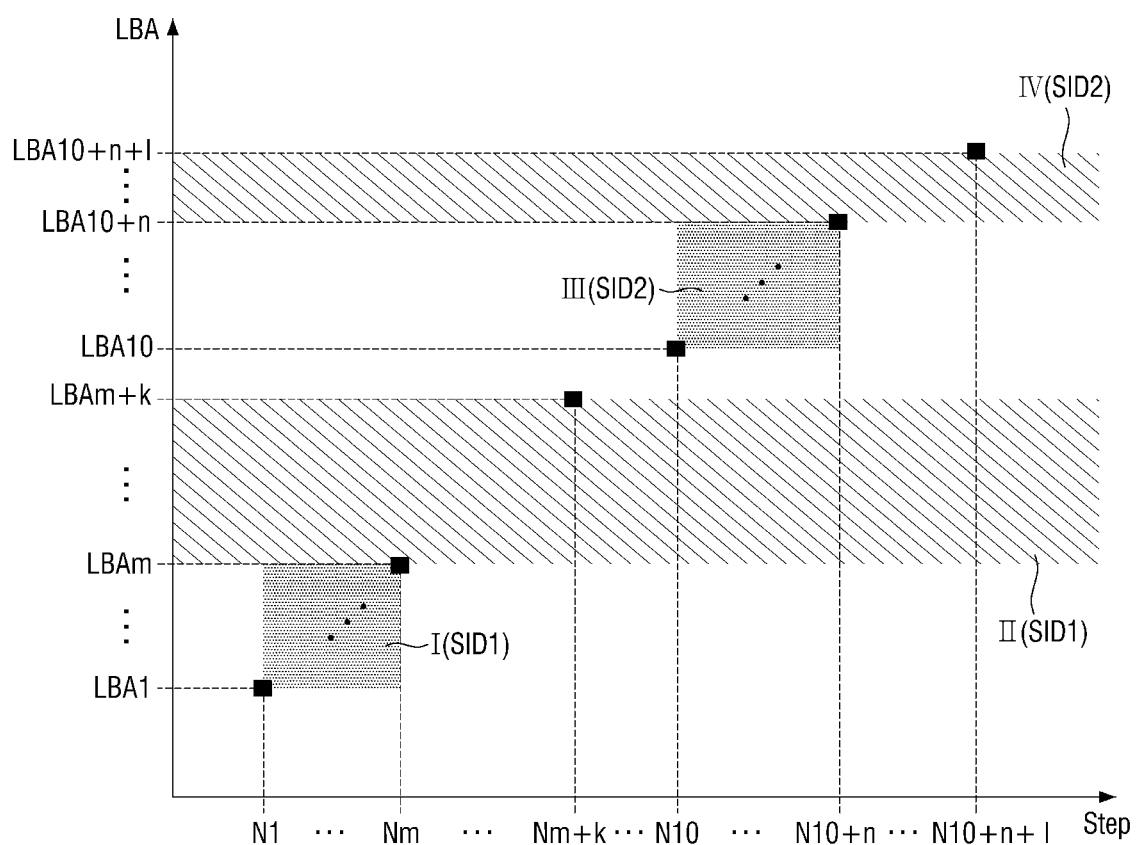

FIG. 6 is another graph illustrating operation of a storage device predicting LBA values according to some embodiments.

Referring to FIGS. 1, 4 and 6, it is assumed that the LBA predictor 30 reads 'm' LBA values associated with the first stream ID (SID1) falling within the first area 'I' of the graph (i.e., the first ID-specific LBA related information) as the features of the neural network model used to predict the $(m+k)^{th}$ LBA value (LBAm+k).

Additionally, it is assumed that the LBA predictor 30 reads 'n' LBA values associated with the second stream ID (SID2) falling within the third area III (i.e., the second ID-specific LBA related information) as the features of the neural network model used to predict the $(10+n+l)^{th}$ LBA value (LBA10+n+l).

Notably, although FIG. 6 particularly illustrates only the first stream ID (SID1) and the second stream ID (SID2) as examples, any reasonable number of stream IDs may be similarly predicted. For example, when data (e.g., LBA values) lacking a stream ID are received from the host 10 and thereafter determined to fall within the second area 'II', the storage device 20 may assign the first stream ID (SID1) to the data, and when data (e.g., LBA values) lacking a stream ID are received from the host 10 and thereafter determined to fall within the fourth area IV, the storage device 20 may assign the second stream ID (SID2) to the data.

Figure 7:
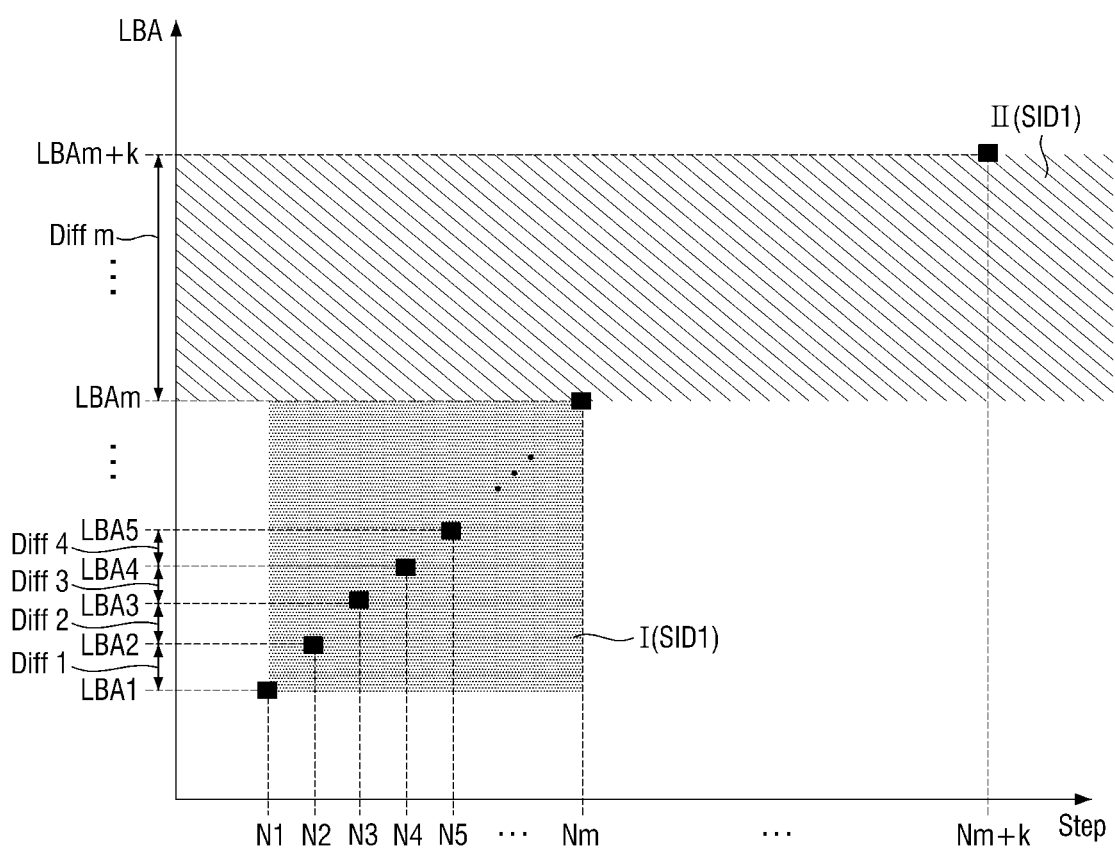

FIG. 7 is another graph illustrating operation of a storage device predicting LBA values according to some embodiments.

Referring to FIGS. 1, 4 and 7, the LBA predictor 30 may read (or input) differences (e.g., Diff 1 through Diff 4) between 'm' previously received LBA values (e.g., LBA1 through LBAm) associated with the same first stream ID as the features of the neural network model. That is, the differences between the LBA values falling within a first area 'I' may be input as the features to the neural network model. The LBA values of the first area 'I' may all be associated with the same stream ID (e.g., the first stream ID). Accordingly, the LBA predictor 30 may drive the neural network model to predict the $m^{th}$ LBA difference (Diff m). With this configuration, the LBA predictor 30 may predict the $(m+k)^{th}$ LBA value (LBAm+k) obtained by adding the $m^{th}$ LBA difference (Diff m) to the $m^{th}$ LBA value (LBAm).

Thereafter, the LBA predictor 30 may receive data (e.g., LBA values) lacking a stream ID and determine an area of the graph in which the LBA values lacking a stream IDs are located.

The LBA predictor 30 may assign the first stream ID (SID1) to the received LBA values of the second area 'II' that are larger than the $m^{th}$ LBA value (LBAm) and less than or equal to the $(m+k)^{th}$ LBA value (LBAm+k).

For the LBA values lacking a stream ID, the LBA predictor 30 in the storage device 20 may assign stream IDs in advance in the above manner to write data lacking a stream ID using a predicted stream ID into the same block of the NVM 50. Accordingly, it is possible to mitigate or prevent wear of the constituent nonvolatile memory cell of the NVM 50. As a result, write amplification for the storage device 20 may be reduced, thereby improving the reliability of the storage device 20.

FIG. 8 is an exemplary table illustrating iteration step relationships for certain LBA information used in predicting LBA values according to some embodiments.

Referring to FIGS. 1, 4 and 8, the LBA predictor 30 may read (or input) certain start LBA values and certain LBA sizes for previously received LBA values associated with the same stream ID (e.g., the first steam ID) as features of the neural network model. Certain End LBA values for 'm' LBA values may be derived by adding the LBA sizes to the start LBA values, respectively. The LBA predictor 30 may then predict the $(m+k)^{th}$ LBA value having the same stream ID using the LBA size table that stores information on the start LBA values, LBA sizes, and end LBA values for the respective m LBA values.

Operation of the LBA predictor 30 according to some embodiments predicts LBA values by inputting, as the features of the neural network model, the start LBA values and LBA sizes of the past m LBA values having the same first stream ID, will be described in some additional detail with reference to FIG. 9.

Figure 9:
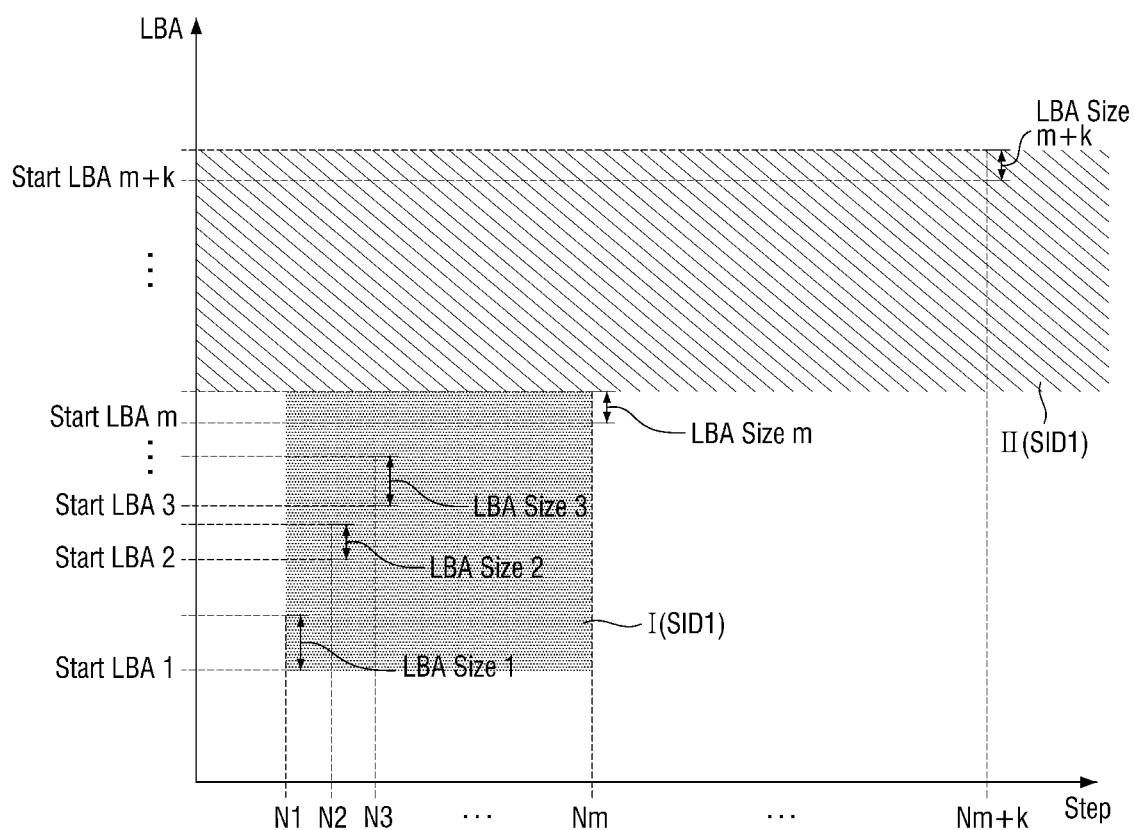
FIGS. 9 and 10 are respective graphs further illustrating operation of the storage device predicting LBA values according to some embodiments.

FIG. 9 is another graph describing an operation of predicting LBA values using the LBA information of FIG. 8 according to some embodiments.

Referring to FIGS. 1, 4, 8 and 9, the LBA predictor 30 may read (or input) the start LBA values (Start LBA 1~Start LBA m) and LBA sizes (LBA size 1~LBA size m) of the previously received LBA values associated with the same first stream ID as the features of the neural network model. That is, the start LBA values (Start LBA 1~Start LBA m) and LBA sizes (LBA Size 1~LBA Size m) of the LBA values of the first area I may be input as the features of the neural network model. The LBA values of the first area I may all have the same stream ID (e.g., the first stream ID). The LBA predictor 30 in the storage device 20 may drive the neural network model to predict the $(m+k)^{th}$ start LBA value (Start LBA m+k) and the $(m+k)^{th}$ LBA size (LBA Size m+k). Through this configuration, the LBA predictor 30 in the storage device 20 may predict the $m+k^{th}$ LBA value obtained by adding the $m+k^{th}$ LBA size (LBA Size m+k) to the $m+k^{th}$ start LBA value (Start LBA m+k).

Thereafter, the LBA predictor 30 may receive data (e.g., LBA values) lacking a stream ID and may determine an area in which the LBA values lacking a stream ID may be located.

The LBA predictor 30 may assign the first stream ID (SID1) to the received LBA values of the second area II that are larger than the $m^{th}$ LBA value and less than or equal to the $(m+k)^{th}$ LBA value, wherein the $m^{th}$ LBA value is obtained by adding the $m^{th}$ LBA size (LBA Size m) to the $m^{th}$ start LBA value (Start LBA m), and the $(m+k)^{th}$ LBA value is obtained by adding the $(m+k)^{th}$ LBA size (LBA Size m+k) to the $(m+k)^{th}$ start LBA value (Start LBA m+k).

For the LBA values having no stream IDs assigned thereto from the host 10, the LBA predictor 30 in the storage device 20 may assign stream IDs in advance in the above manner to write data having the same stream ID into the same block of the NVM 50. Accordingly, it is possible to mitigate or prevent wear of the constituent nonvolatile memory cells of the NVM 50. As a result, write amplification for the storage device 20 may be reduced, thereby improving the reliability of the storage device 20.

Figure 10:
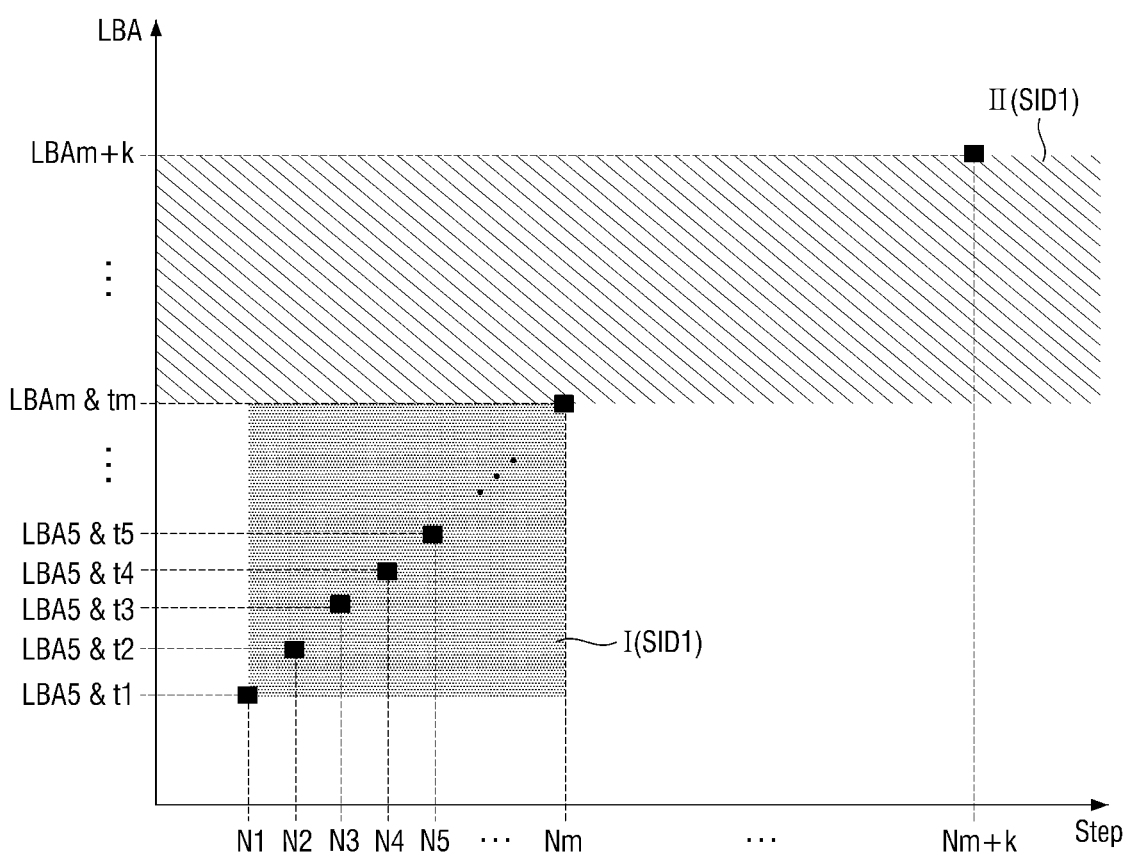

FIG. 10 is another graph illustrating an operation of the storage device predicting LBA values according to some embodiments.

Referring to FIGS. 1, 4 and 10, the LBA predictor 30 may read (or input), as features of the neural network model, 'm' previously received LBA values (LBA1~LBAm) associated with the same first stream ID and time information (t1~tm) at which the respective LBA values (LBA1~LBAm) were received. That is, the LBA values (LBA1~LBAm) and input time information (t1~tm) of the LBA values (LBA1~LBAm) of the first area I may be input as the features of the neural network model. The LBA values of the first area I may all have the same stream ID (e.g., the first stream ID). The LBA predictor 30 in the storage device 20 may drive the neural network model to predict the $(m+k)^{th}$ LBA value (LBAm+k).

Since the LBA predictor 30 in the storage device 20 includes the time information (t1~tm) as an input of the neural network model, it is possible to further improve the prediction accuracy for the $m+k^{th}$ LBA value (LBAm+k). More specifically, even though a certain LBA value falls within the first area 'I', if the time that the LBA value has entered is at an excessively long time interval (where the criteria of the time interval may be freely limited with the configuration of the neural network model) from the other LBA values previously falling within the first area I, the LBA value may be excluded from the prediction of the $(m+k)^{th}$ LBA value (LBAm+k).

Thereafter, the LBA predictor 30 may receive data (e.g., LBA values) lacking a stream ID and may determine an area in which the LBA values lacking a stream ID are likely to be located.

The LBA predictor 30 may assign the first stream ID (SID1) to the received LBA values of the second area II that are larger than the $m^{th}$ LBA value (LBAm) and less than or equal to the $(m+k)^{th}$ LBA value (LBAm+k).

For the LBA values lacking a stream IDs, the LBA predictor 30 may assign stream IDs in advance in the above manner to write data having the same predicted stream ID into the same block in the NVM 50. Accordingly, it is possible to mitigate or prevent wear of the constituent nonvolatile memory cells of the NVM 50. As a result, write amplification of the storage device 20 may be reduced, thereby improving the reliability of the storage device 20.

Notably, the values 'n', 'm', and 'l' used above are each a natural number. Specifically, may be a natural number greater than 'm', and 'l' may be a natural number greater than 'n', but embodiments are not limited thereto.

Figure 11:
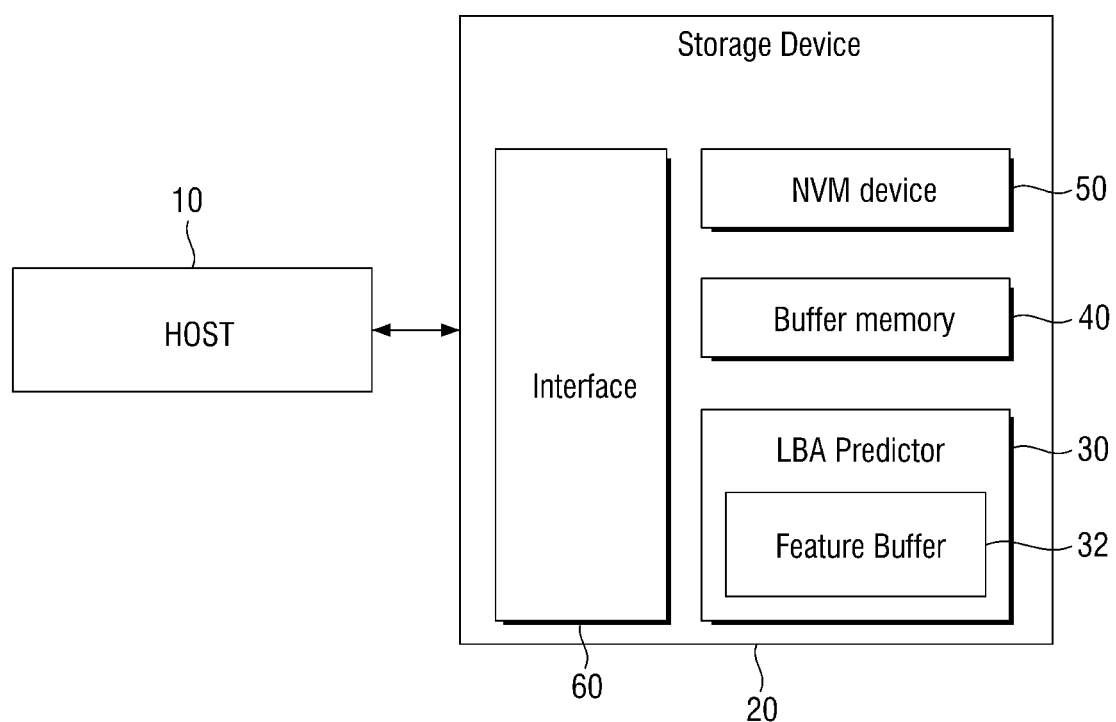
FIGS. 11, 12 and 13 are block diagrams illustrating storage systems according to some embodiments.
Figure 12:
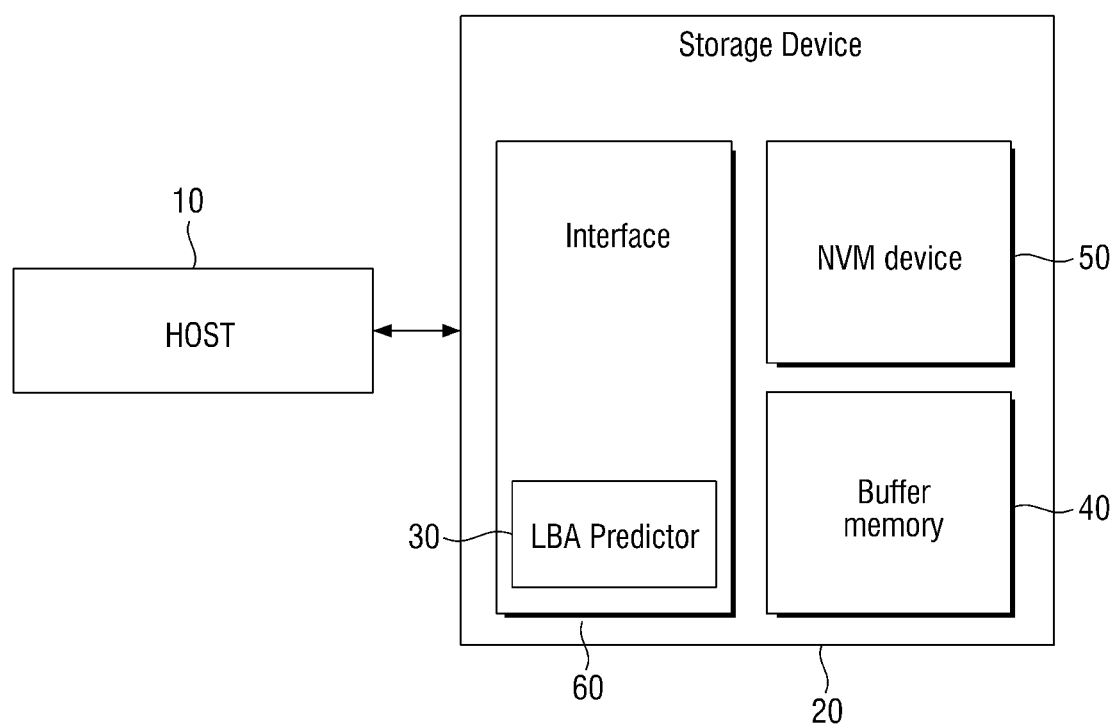
Figure 13:
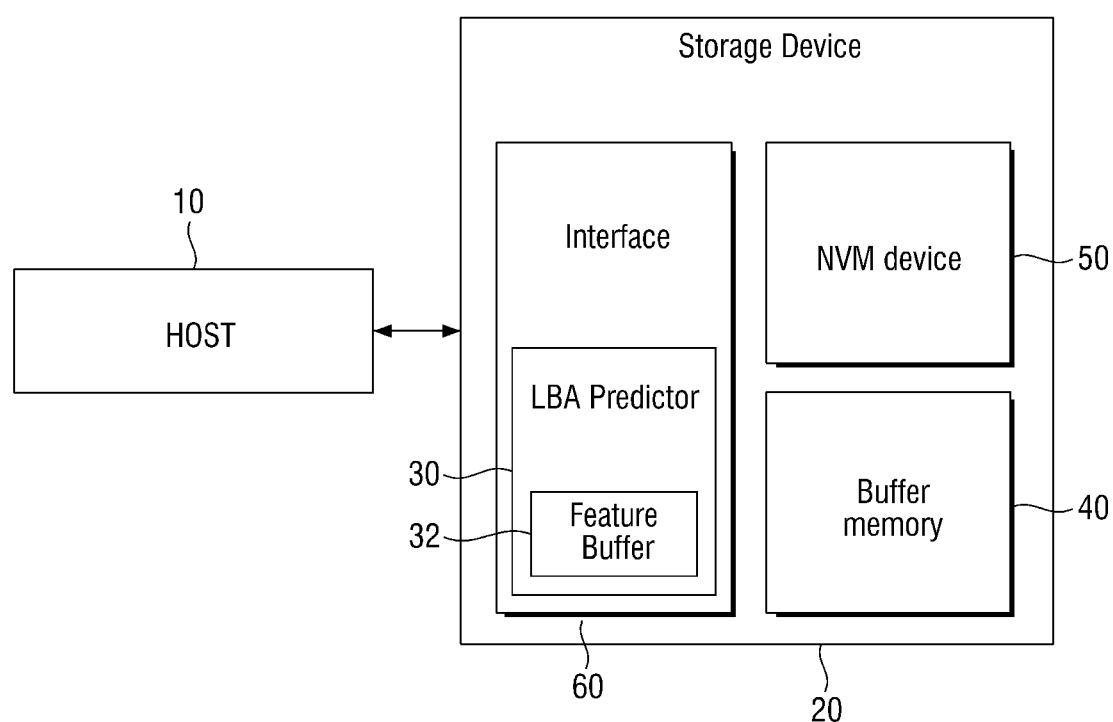

FIGS. 11, 12 and 13 are respective block diagrams illustrating a storage system according to some embodiments.

Referring to FIG. 11, the LBA predictor 30 of the storage device 20 in a storage system 2 may further include a feature buffer 32, as compared with the embodiment of FIG. 1.

The feature buffer 32 may be used to temporarily store LBA related information. The feature buffer 32 may include volatile memory cells such as a DRAM cell, a SRAM cell, and the like.

The LBA predictor 30 may temporarily store in the feature buffer 32 the LBA related information used to predict an LBA value having the same stream ID after a certain step, and may load it for use when driving the neural network model.

Referring to FIG. 12, the LBA predictor 30 of the storage device 20 in a storage system 3 according to some embodiments may be included in the interface 60, as compared with the embodiment of FIG. 1, and referring to FIG. 13, the LBA predictor 30 of a storage system 4 may further include a feature buffer 32 as compared with the embodiment of FIG. 12.

Figure 14:
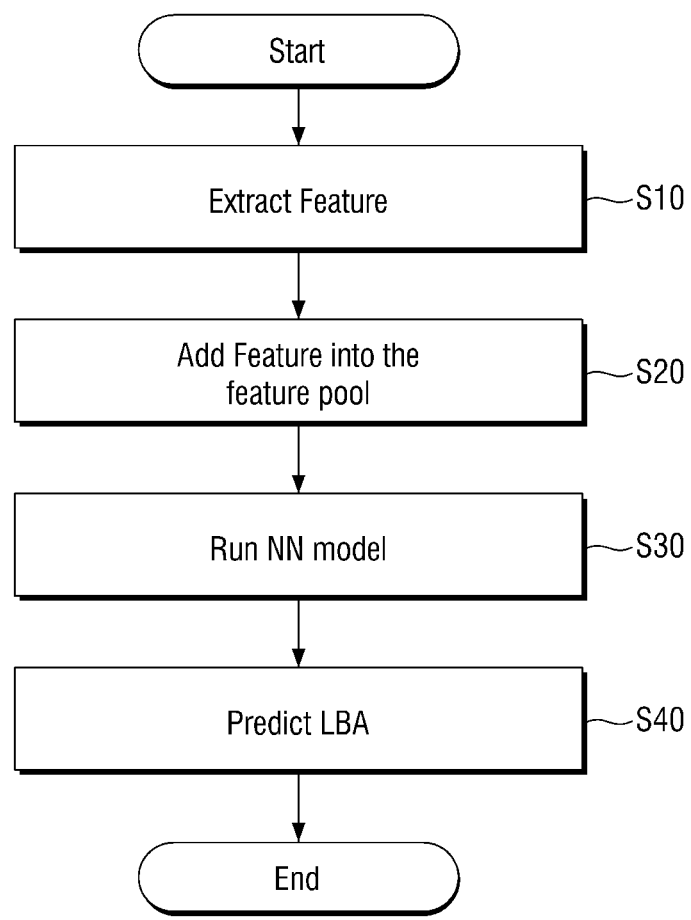
FIG. 14 is a flowchart summarizing an operating method for a storage system according to some embodiments.

FIG. 14 is a flowchart summarizing an operation method for a storage system according to some embodiments.

Referring to FIGS. 1 and 14, the storage system 1 may extract LBA related information as the features to be input to a neural network model used to predict LBA values (S10).

Thereafter, the storage system 1 may group into a feature pool, the LBA related information extracted as the features to be input to the neural network model (S20). Here, the feature pool may be grouped according to separate ID-specific LBA related information associated with the same stream ID.

In order to drive the neural network model, the storage system 1 may use the respective features (e.g., ID-specific LBA related information associated with the same stream ID of the feature pool) to drive (or run) the neural network model (S30).

The storage system 1 may thus predict LBA values through the neural network model (S40).

What is claimed is:

1. A storage device comprising:
a buffer memory configured to store first identifier (ID)-specific Logical Block Address (LBA) related information associated with a first stream ID and further associated with 'm' LBA values, and second ID-specific LBA related information associated with a second stream ID and further associated with 'n' LBA values; and
an LBA predictor including a neural network model and configured to predict an $(m+k)^{th}$ LBA value based on the first ID-specific LBA related information and predict an $(n+l)^{th}$ LBA value based on the second ID-specific LBA related information, where n, m, k and l are natural numbers,
wherein the neural network model is configured to
receive the first ID-specific LBA related information as a first feature used to predict the $(m+k)^{th}$ LBA value,
receive the second ID-specific LBA related information as a second feature used to predict the $(n+l)^{th}$ LBA value,
assign the first stream ID to an LBA value greater than an $m^{th}$ LBA value and less than or equal to the $(m+k)^{th}$ LBA value, and
assign the second stream ID to an LBA value greater than an $n^{th}$ LBA value and less than or equal to the $(n+l)^{th}$ LBA value.

2. The storage device of claim 1, wherein a first LBA value associated with the second ID-specific LBA related information is greater than a last LBA value associated with the first ID-specific LBA related information.

3. The storage device of claim 1, wherein each of the m LBA values includes a start LBA value and an LBA size value, and the neural network model is further configured to predict an $(m+k)^{th}$ start LBA value.

4. The storage device of claim 1, wherein k is greater than m, and l is greater than n.

5. The storage device of claim 1, wherein the LBA predictor includes a feature buffer configured to store at least one of the first ID-specific LBA related information and the second ID-specific LBA related information.

6. The storage device of claim 5, wherein the first ID-specific LBA related information is stored in the feature buffer in at least one of a queue, an array, and a list.

7. The storage device of claim 1, wherein the first ID-specific LBA related information includes a time at which an associated LBA value is received by the storage device.

8. The storage device of claim 1, wherein the first ID-specific LBA related information includes a time interval at which an associated LBA is received by the storage device.

9. The storage device of claim 1, wherein the neural network model is a regression model or a classification model.

10. The storage device of claim 1, wherein the neural network model is a single layer perceptron (SLP) model or a multi-layer perceptron (MLP) model.

11. The storage device of claim 1, wherein the buffer memory is a dynamic random access memory (DRAM) or a static random access memory (SRAM).

12. A storage device comprising:
an interface configured to receive data and a corresponding Logical Block Address (LBA) from a host, wherein the data includes at least one of first data having a stream ID and second data lacking a stream ID;
a nonvolatile memory (NVM) device including at least one nonvolatile memory configured to store the data;
a buffer memory; and
a LBA predictor configured to provide a predicted stream ID for the second data using a neural network model operating in response to at least one feature associated with LBA values received by the storage device from the host,
wherein the first data is stored in the NVM device using the stream ID, and the data is stored in the NVM device using the predicted stream ID,
wherein the at least one feature includes a first feature and a second feature,
wherein the LBA predictor is further configured to bundle the first feature and the second feature in a feature pool stored in the buffer memory, and
wherein the LBA predictor is further configured to weight the first feature using a first weight to generate a first weighted feature, weight the second feature using a second weight to generate a second weighted feature, and sum the first weighted feature and the second weighted feature to generate a summation result.

13. The storage device of claim 12, wherein the at least one feature includes at least one of LBA values, LBA sizes, a number of times an LBA is received in the storage device, and a time interval according to which a LBA is received in the storage device.

14. The storage device of claim 12, wherein the LBA predictor is configured within the interface.

15. A storage system, comprising: a host configured to output 'm' Logical Block Address (LBA) values; and a storage device, wherein the storage device includes: an interface configured to communicate with the host and receive the m LBA values, a buffer memory configured to temporarily store the m LBA values, a nonvolatile memory device configured to store data corresponding to the m LBA values, and an LBA predictor configured to predict an $(m+k)^{th}$ LBA value using a neural network model in response to first identifier (ID)-specific LBA related information associated with a first stream ID and second ID-specific LBA related information associated with a second stream ID input to the neural network as a feature, wherein the neural network model is configured to receive the first ID-specific LBA related information as a first feature used to predict the $(m+k)^{th}$ LBA value, receive the second ID-specific LBA related information as a second feature used to predict an $(n+1)^{th}$ LBA value, assign the first stream ID to an LBA value greater than an $m^{th}$ LBA value and less than or equal to the $(m+k)^{th}$ LBA value, and assign the second stream ID to an LBA value greater than an $n^{th}$ LBA value and less than or equal to the $(n+1)^{th}$ LBA value.

16. The storage system of claim 15, wherein the storage device further includes a feature buffer configured to store the first ID-specific LBA related information.

17. An operating method for a storage system, the method comprising:

storing first identifier (ID)-specific Logical Block Address (LBA) related information associated with a first stream ID and second ID-specific LBA related information associated with a second stream ID in a buffer memory, wherein the first ID-specific LBA related information is associated with 'm' LBA values and the second ID-specific LBA related information is associated with 'n' LBA values;

predicting with the use of an LBA predictor including a neural network model, an $(m+k)^{th}$ LBA value in response to the first identifier (ID)-specific LBA related information associated with a first stream ID and an $(n+1)^{th}$ LBA value in response to the second ID-specific LBA related information associated with a second stream ID;

assigning the first stream ID to an LBA value greater than an $m^{th}$ LBA value and less than or equal to the $(m+k)^{th}$ LBA value, and assigning the second stream ID to an LBA value greater than an $n^{th}$ LBA value and less than or equal to the $(n+1)^{th}$ LBA value.

18. The operating method of claim 17, wherein the first identifier (ID)-specific LBA related information includes at least one of first identifier (ID)-specific LBA values, first identifier (ID)-specific LBA sizes, a number of times a first identifier ID-specific LBA is received in a storage device, and a time interval according to which a first identifier (ID)-specific LBA is received in the storage device.

* * * * *